(12) United States Patent
Smith et al.

(10) Patent No.: US 7,879,665 B2
(45) Date of Patent: Feb. 1, 2011

(54) STRUCTURE AND METHOD OF FABRICATING A TRANSISTOR HAVING A TRENCH GATE

(75) Inventors: Michael Smith, Boise, ID (US); Mark Helm, Boise, ID (US); Kirk Prall, Boise, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

(21) Appl. No.: 12/033,730

(22) Filed: Feb. 19, 2008

(65) Prior Publication Data
US 2008/0200005 A1    Aug. 21, 2008

Related U.S. Application Data

(62) Division of application No. 11/038,985, filed on Jan. 20, 2005, now Pat. No. 7,332,419, which is a division of application No. 10/712,212, filed on Nov. 13, 2003, now Pat. No. 6,949,795.

(51) Int. Cl.
*H01L 21/336* (2006.01)

(52) U.S. Cl. .................. 438/197; 438/589; 438/270; 257/330

(58) Field of Classification Search .......... 438/197, 438/589, 424, 282, 270, 294, 269; 257/329, 257/401, 330, 331
See application file for complete search history.

(56) References Cited

U.S. PATENT DOCUMENTS

| | | | |
|---|---|---|---|
| 5,796,143 A | 8/1998 | Fulford et al. | |
| 5,814,547 A | 9/1998 | Chang | |
| 5,864,158 A | 1/1999 | Liu et al. | |
| 6,451,639 B1 | 9/2002 | Jang et al. | |
| 6,555,427 B1 | 4/2003 | Shimizu et al. | |
| 6,569,737 B2 | 5/2003 | Park et al. | |
| 6,624,043 B2 | 9/2003 | Hsu | |
| 6,649,979 B2 | 11/2003 | Jang | |
| 6,737,309 B2 | 5/2004 | Matsuo | |
| 6,756,273 B2 | 6/2004 | Hadizad et al. | |
| 6,759,702 B2 | 7/2004 | Radens et al. | |
| 6,815,290 B2 | 11/2004 | Lin et al. | |
| 6,949,795 B2 | 9/2005 | Smith et al. | |
| 7,279,710 B2 | 10/2007 | Smith et al. | |

(Continued)

OTHER PUBLICATIONS

Yanagisawa, et al.; Trench Transistor Cell With Self-Aligned Contact (TSAC) for Megabit MOS DRAM; 1st LSI Division, NEC Corporation; 1120 Shimokuzawa, Sagamihara, Kanagawa 229, Japan; pp. 132-135.

(Continued)

*Primary Examiner*—Steven Loke
*Assistant Examiner*—David Goodwin
(74) *Attorney, Agent, or Firm*—Lerner, David, Littenberg, Krumholz & Mentlik, LLP

(57) ABSTRACT

An integrated circuit transistor is fabricated with a trench gate having nonconductive sidewalls. The transistor is surrounded by an isolation trench filled with a nonconductive material. The sidewalls of the gate trench are formed of the nonconductive material and are substantially free of unetched substrate material. As a result, the sidewalls of the gate trench do not form an undesired conductive path between the source and the drain of the transistor, thereby advantageously reducing the amount of parasitic current that flows between the source and drain during operation.

17 Claims, 8 Drawing Sheets

U.S. PATENT DOCUMENTS 7,332,419 B2 2/2008 Smith et al.
2002/0094622 A1* 7/2002 Sneelal et al. ............... 438/197

OTHER PUBLICATIONS

Landgraf, et al.; Scalable High Voltage Trenchgate Transistor for Flash; University of Regensburg, Conference: ESSDERC 2000; 93040 Regensburg, Germany; pp. 380-383.

Hieda, et al.; Sub-Half-Micrometer Concave MOSFET With Double LDD Structure; IEEE Transactions on Election Devices, vol. 39, No. 3, Mar. 1992, pp. 671-676.

Sakao, et al. A Straight-Line Trench Isolation and Trench-Gate Transistor (SLIT) Cell for Giga-Bit DRAMS; ULSI Device Development Laboratories, NEC Corporation; 1120, Shimokuzawa, Sagamihara, Kanagawa 229, Japan; pp. 19 and 20.

* cited by examiner

STRUCTURE AND METHOD OF FABRICATING A TRANSISTOR HAVING A TRENCH GATE

This application is a divisional of U.S. patent application Ser. No. 11/038,985, filed on Jan. 20, 2005, now U.S. Pat. No. 7,332,419 which is a divisional of U.S. patent application Ser. No. 10/712,212, filed on Nov. 13, 2003, now U.S. Pat. No. 6,949,795 issued Sep. 27, 2005 the entirety of which are hereby incorporated herein by reference.

BACKGROUND OF THE INVENTION

1. Field of the Invention

The present invention relates to integrated circuit transistors. In particular, the invention relates to a structure and method of fabricating a transistor having a trench gate.

2. Description of the Related Art

Integrated circuit designers often desire to increase the density of elements within an integrated circuit by reducing the size of the individual elements and reducing the separation distance between neighboring elements. One example of a common integrated circuit element is a transistor, which can be found in many devices, such as memory circuits, processors, and the like. A typical integrated circuit transistor comprises a source, a drain, and a gate formed at the surface of the substrate.

Although it is generally desirable to reduce the size of integrated circuit transistors, the ability to shrink certain dimensions, such as the length of the gate, can be limited due to the voltage levels needed to perform certain operations. In one example, a relatively high amount of voltage can be required by some transistors used in flash memory to perform certain operations, such as program, read, and erase. One approach for reducing the size of such transistors while maintaining the gate length necessary to satisfy the voltage requirements is to form the transistor gate as a trench below the surface of the substrate.

In one example, a transistor gate can be implemented as a U-shaped trench connecting the source and the drain. Such a U-shaped gate trench maintains the gate length while allowing the gate surface area to decrease.

SUMMARY OF THE INVENTION

Present fabrication methods for a transistor with a U-shaped gate trench produce a transistor structure that is prone to parasitic current traveling from the source to the drain along the gate trench sidewall due to unetched substrate material present at the gate trench sidewall. In addition, it is difficult to maintain isolation between gate trench bottoms of neighboring transistors using current fabrication techniques. A unique transistor structure and a fabrication process are disclosed to prevent unetched substrate material from forming along the gate trench sidewall and to facilitate isolation of neighboring transistors.

In one embodiment of the present invention, a semiconductor device comprises a transistor having a source and a drain comprising a substrate material and a gate trench between the source and the drain. The device also comprises an isolation trench filled with a nonconductive material surrounding the transistor. The gate trench has sidewalls comprising the nonconductive material, which are substantially free of the substrate material.

In another embodiment, an integrated circuit transistor comprises a source, a drain, and a gate trench between the source and the drain. The gate trench has nonconductive sidewalls and has a first depth. The transistor is surrounded by an isolation trench having a second depth that is greater than the first depth. The nonconductive sidewalls of the gate trench are formed at a point toward the middle of the gate trench and away from the isolation trench.

In another embodiment, a method of forming a semiconductor element comprises providing a semiconductor substrate having a hard mask layer deposited thereon, patterning the hard mask layer with a first photo mask, and etching the semiconductor substrate to form an isolation trench having a first depth. The method further comprises patterning the hard mask layer with a second photo mask, and etching the semiconductor substrate to form a gate trench having a second depth and simultaneously etching the isolation trench to a third depth, wherein the third depth is greater than the second depth.

In another embodiment, a method of fabricating a transistor comprises patterning a substrate with a first mask, forming an isolation trench in the substrate, and depositing a nonconductive material in the isolation trench. The method further comprises patterning the substrate with a second mask and forming a gate trench surrounded by a ridge of substrate material, wherein the ridge of substrate material is separated from a source, a drain, and a gate by a separation trench. The method further comprises filling the gate trench and the separation trench with the nonconductive material, patterning the nonconductive material with a third mask, and removing the nonconductive material from a region of the gate trench, thereby forming a trench with sidewalls comprising the nonconductive material.

BRIEF DESCRIPTION OF THE DRAWINGS

These and other features and advantages of the invention will now be described with reference to the drawings of certain preferred embodiments, which are intended to illustrate, and not to limit, the invention. Throughout the drawings, reference numbers are re-used to indicate correspondence between referenced elements.

More specifically, FIG. 1 is a perspective view of a semiconductor device in which a transistor can be formed.

FIG. 2 illustrates an active area photo mask to be applied to the device illustrated in FIG. 1.

FIG. 3 illustrates the device of FIG. 1 after the active area photo mask of FIG. 2 has been applied to pattern the hard mask layer.

FIG. 4 illustrates the device of FIG. 3 after an isolation trench has been partially etched.

FIG. 5 illustrates a gate area photo mask to be applied to the device illustrated in FIG. 4.

FIG. 6 illustrates the device of FIG. 4 after the gate area photo mask of FIG. 5 has been applied to further pattern the hard mask layer.

FIG. 7 illustrates the device of FIG. 6 after the gate trench and the isolation trench have been etched.

FIG. 8 illustrates the device of FIG. 7 after a nonconductive material has been applied as a blanket layer over the partially formed transistor.

FIG. 9 illustrates a gate trench photo mask to be applied to the device illustrated in FIG. 8.

FIG. 10 illustrates the device of FIG. 8 after the gate trench photo mask of FIG. 9 has been applied and a gate trench has been etched to form a transistor having a gate trench with nonconductive sidewalls.

FIG. 11 is a perspective view of another semiconductor device in which an isolation trench has been formed and in which a transistor can be formed.

FIG. 12 illustrates a gate area photo mask to be applied to the device illustrated in FIG. 11.

FIG. 13 illustrates the device of FIG. 11 after application of the gate area photo mask of FIG. 12 and subsequent etching.

FIG. 14 illustrates the device of FIG. 13 after a nonconductive material has been deposited over the partially formed transistor.

FIG. 15 illustrates a gate trench photo mask to be applied to the device illustrated in FIG. 14.

FIG. 16 illustrates the device of FIG. 14 after the gate trench photo mask of FIG. 15 has been applied and a gate trench has been etched to form a transistor having a gate trench with nonconductive sidewalls.

DETAILED DESCRIPTION OF THE PREFERRED EMBODIMENT

For purposes of illustration, various embodiments of the invention will be described in the context of a transistor having a particular configuration. For example, in some embodiments, an integrated circuit transistor is formed in accordance with the present invention by performing the method illustrated in FIGS. 1-10. In other embodiments, an integrated circuit transistor is formed in accordance with the present invention by performing the method illustrated in FIGS. 11-16. The details associated with these exemplary structures and methods are set forth to illustrate, and not to limit, the invention. The scope of the invention is limited only by the appended claims.

Figure 1:
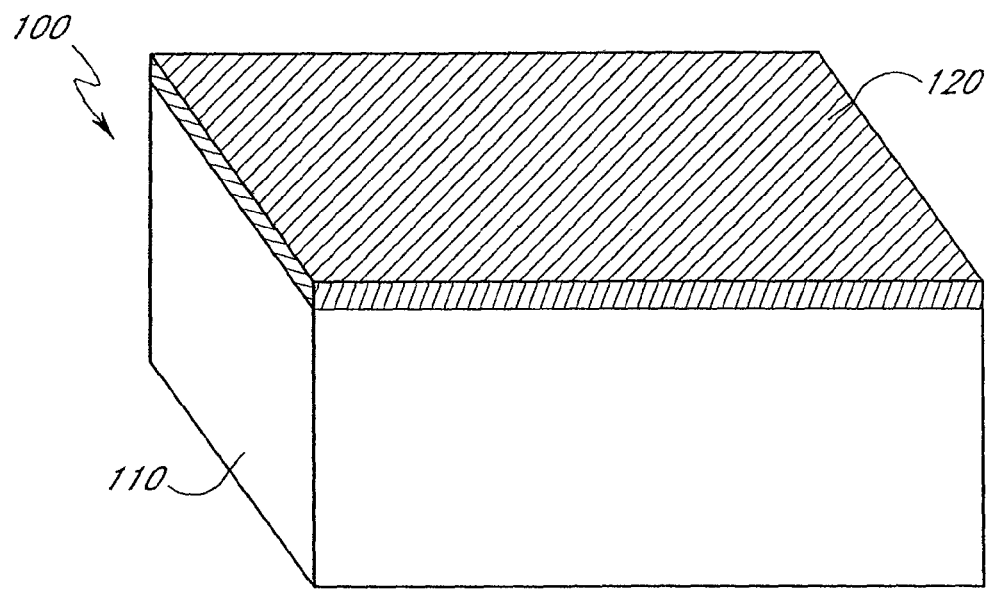
FIGS. 1-10 illustrate the formation of an integrated circuit transistor in accordance with one embodiment of the present invention.

FIG. 1 is a perspective view of a semiconductor device 100 in which a transistor can be formed. The device 100 includes a substrate 110, which may comprise any of a wide variety of suitable materials. For example, while the substrate 110 illustrated in FIG. 1 comprises an intrinsically doped monocrystalline silicon wafer, those of ordinary skill in the art will understand that the substrate 110 in other devices can comprise other materials and/or additional semiconductor layers.

Although a single device 100 is illustrated in FIG. 1, those of ordinary skill in the art will understand that a plurality of semiconductor devices 100 are preferably fabricated simultaneously on the same substrate 110. For example, the device 100 can be one of many like devices arranged in an array.

As illustrated in FIG. 1, the substrate 110 is coated with a layer of material 120 suitable to be used as a hard mask, in accordance with one embodiment of the invention. The substrate 110 can also be coated with an optional nitride layer (not shown). The hard mask 120 can comprise TEOS, amorphous carbon, $Si_3N_4$, $SiO_3N_4$, SiC, or any other suitable hard mask material, having a thickness preferably within the range of about 100 Å to about 700 Å, more preferably within the range of about 100 Å to about 300 Å.

Figure 2:
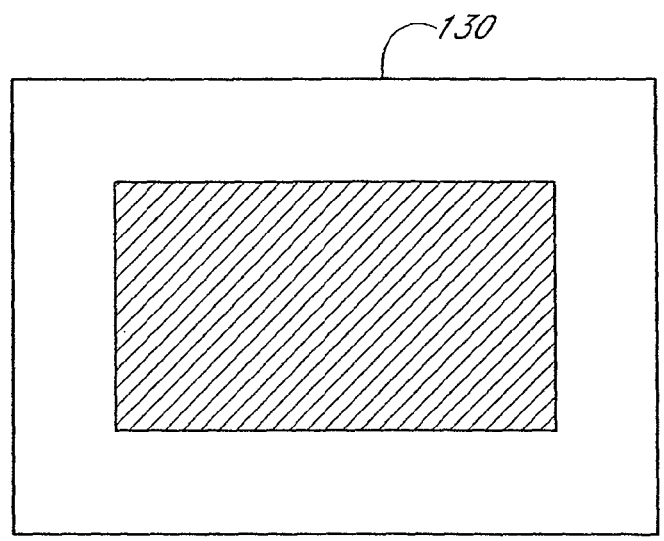

FIG. 2 illustrates an active area photo mask 130 to be applied to the device 100 illustrated in FIG. 1 to pattern the hard mask layer 120. The shaded portion of the active area photo mask 130 represents the area in which the hard mask 120 will remain after applying conventional photolithography and etching techniques, and the unshaded portion represents the area in which the hard mask 120 will be removed.

Figure 3:
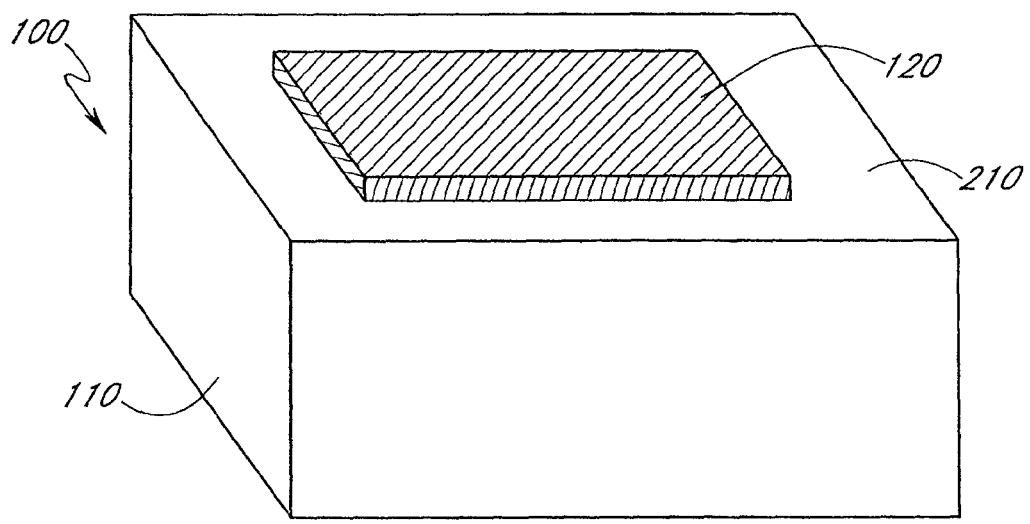

FIG. 3 illustrates the device 100 of FIG. 1 after the active area photo mask 130 has been applied, and the hard mask 120 has been patterned. As illustrated in FIG. 3, the hard mask 120 remains over the area of the substrate 110 in which the transistor will be formed. The hard mask 120 is removed, however, from an area 210 of the substrate 110 in which an isolation trench (also referred to as a shallow trench isolation, or STI, trench) will be formed around the transistor. The hard mask 120 can be patterned using conventional photolithography and etching techniques that are well known to those of ordinary skill in the art.

Figure 4:
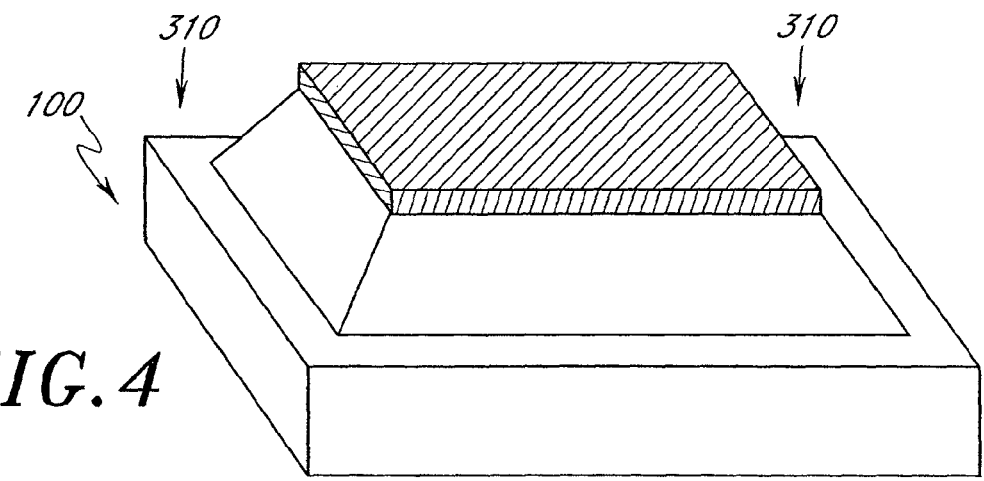

As illustrated in FIG. 4, an isolation trench 310 is etched into the area 210 to a depth that is less than the desired final depth. In some embodiments, the isolation trench 310 is etched using a process such as, for example, ion milling, reactive ion etching, or chemical etching. If an etching process involving a chemical etchant is selected, any of a variety of well-known etchants can be used, such as for example, $Cl_2$.

Figure 5:
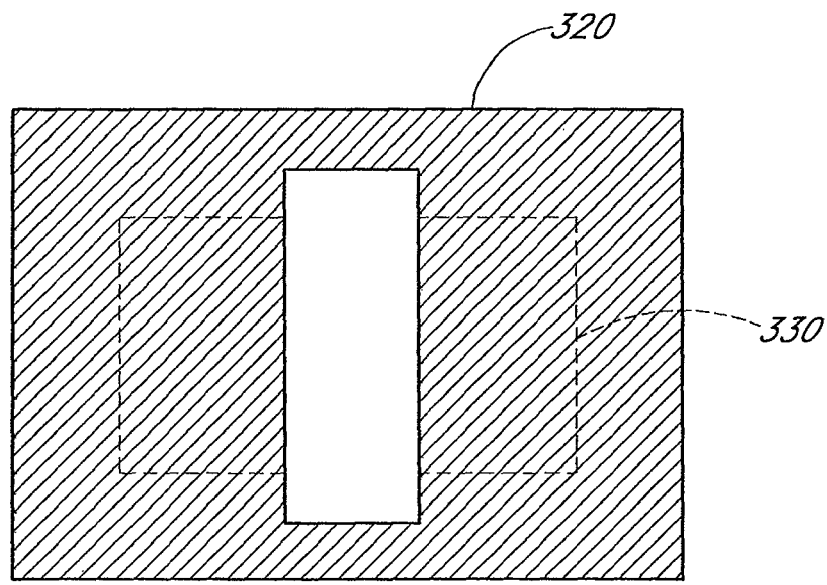

FIG. 5 illustrates a gate area photo mask 320 to be applied to the device 100 illustrated in FIG. 4 to further pattern the hard mask 120. The shaded portion of the mask 320 represents the areas of the substrate 110 and the hard mask 120 that will be protected during the subsequent etching step, and the unshaded portion of the mask 320 represents the areas that will be removed during the subsequent etching step.

The dashed line 330 represents the active areas of the partially formed transistor (e.g., the source, drain, and gate), as defined by the remaining hard mask 120. The dashed line 330 does not form part of the gate area photo mask 320, and is illustrated primarily to show how the mask 320 is aligned over the device 100. Because the purpose of the mask 320 is only to remove the hard mask 120, the unshaded portion of the mask 320 can advantageously be wider than necessary to allow for possible mask misalignment. Thus, in some embodiments, the unshaded portion of the mask 320 extends into the area of the isolation trench 310, as illustrated in FIG. 5.

Figure 6:
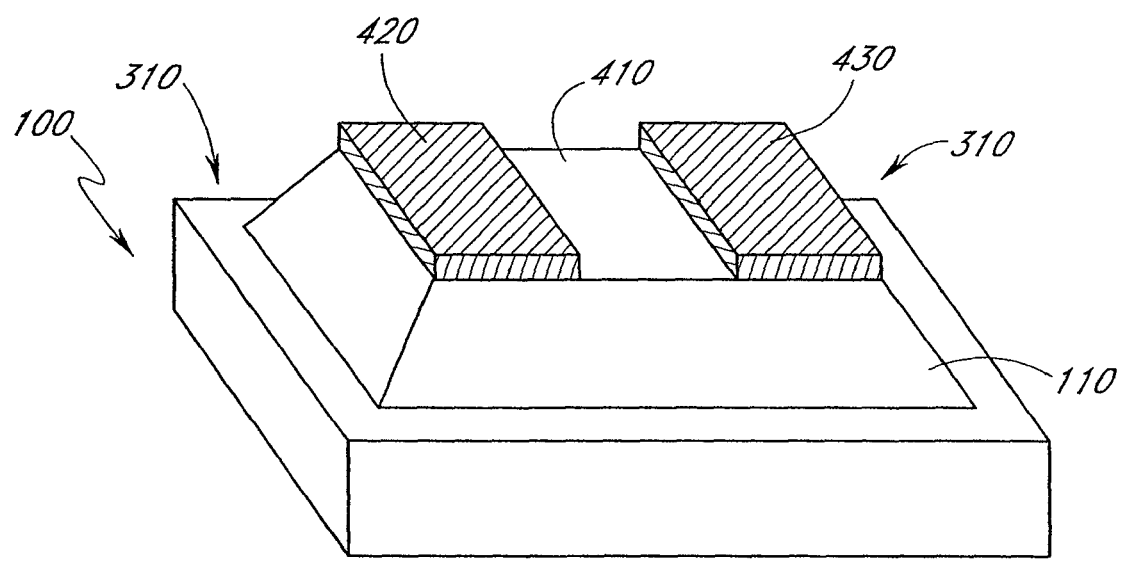

FIG. 6 illustrates the device 100 of FIG. 4 after the gate area photo mask 320 has been applied, and the hard mask 120 has been further patterned. As illustrated in FIG. 6, the hard mask 120 remains over the areas of the substrate 110 in which the source 420 and drain 430 will be formed. The hard mask 120 is removed, however, from the area 410 of the substrate 110 in which the gate trench will be formed.

The hard mask 120 can be patterned using well-known photolithography and etching techniques. For example, in some embodiments, photoresist is deposited as a blanket layer over the device 100 and exposed to radiation through the gate area photo mask 320. Following this exposure, the photoresist film is developed to form a photoresist mask on the surface of the hard mask 120, and the hard mask 120 is etched to expose the area 410 of the substrate 110 in which the gate trench will be formed using at least one suitable etching process. Suitable etching processes, examples of which are described above, are well known to those of skill in the art.

Figure 7:
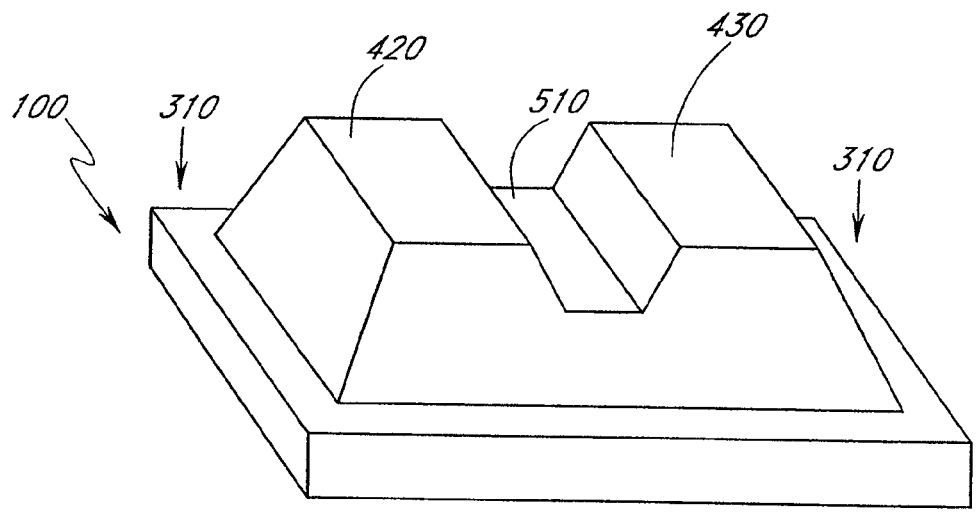

FIG. 7 illustrates the device 100 of FIG. 6 after the gate trench 510 and the isolation trench 310 have been formed by etching the substrate 110 with the hard mask 120 covering the source 420 and the drain 430, and after the hard mask material has been removed. In some embodiments, the gate trench 510 and the isolation trench 310 are etched using a process such as, for example, ion milling, reactive ion etching, or chemical etching. If an etching process involving a chemical etchant is selected, any of a variety of well-known etchants can be used, such as for example, $Cl_2$. In some embodiments, the gate trench 510 forms with rounding at the bottom, or U-shaped, so as to avoid sharp bends in the interface between the substrate 110 and the gate trench 510.

In a preferred embodiment, the sequence of etches illustrated in FIGS. 4 and 7 can be timed such that the resulting depth of both the gate trench 510 and the isolation trench 310 are as desired. The depth of the isolation trench 310 is preferably different than the depth of the gate trench 510. For example, in some embodiments, the depth of the isolation trench 310 is greater than the depth of the gate trench 510. In one exemplary embodiment, the depth of the gate trench 510 falls within the range of about 50 nm to about 300 nm, preferably about 200 nm, and the depth of the isolation trench 310 falls within the range of about 300 nm to about 500 nm, preferably about 350 nm.

As also illustrated in FIG. 7, the hard mask 120 covering the source 420 and the drain 430 is removed using at least one suitable etching process. Examples of suitable etching processes are described above and are well known to those of skill in the art.

Figure 8:
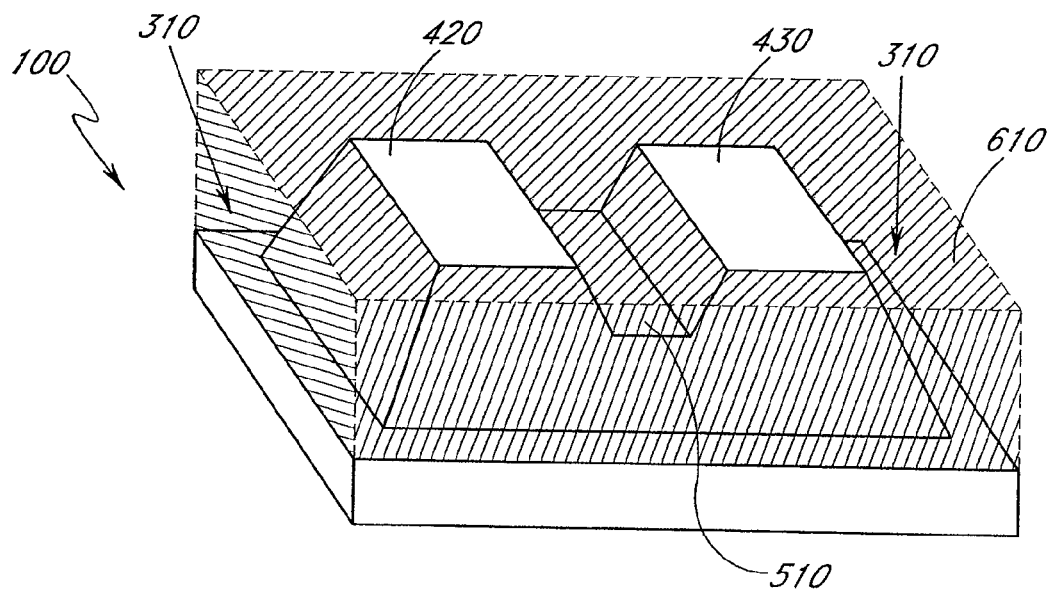

FIG. 8 illustrates the device 100 of FIG. 7 after a nonconductive material 610 has been applied as a blanket layer over the partially-formed transistor. The nonconductive material 610 can comprise any of a wide variety of materials, such as, for example, an oxide material, preferably a high density plasma oxide (HDP oxide). The nonconductive material 610 can be deposited using any suitable deposition process, such as, for example, chemical vapor deposition (CVD) or physical vapor deposition (PVD).

In some embodiments, the nonconductive material 610 fills the isolation trench 310 and the gate trench 510. The nonconductive material 610 can then be polished back to expose the source 420 and the drain 430 using any suitable polishing process, such as, for example, chemical-mechanical planarization (CMP). Preferably, the hard mask material (e.g. nitride) would remain over the source and drain and act as a CMP stop while protecting the source and drain. In this case, the hard mask would be removed after CMP, exposing the source and drain regions.

Figure 9:
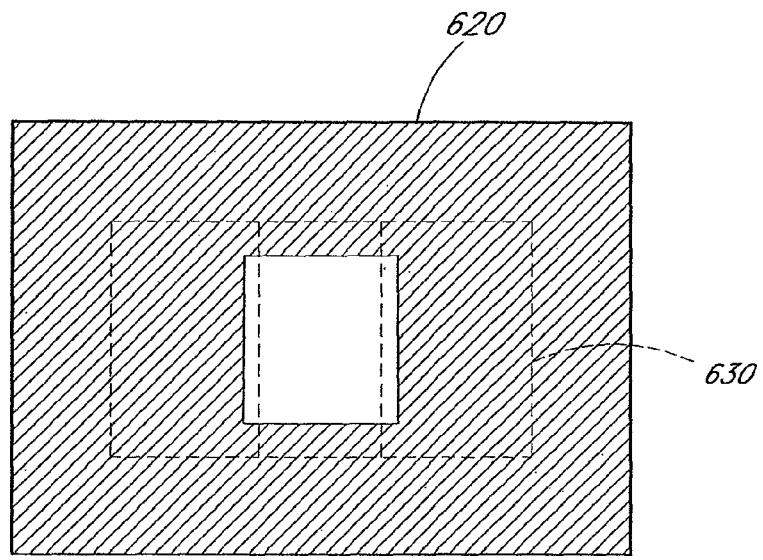

FIG. 9 illustrates a gate trench photo mask 620 to be applied to the device 100 illustrated in FIG. 8. The shaded portion of the mask 620 represents the areas of the substrate 110 and the nonconductive material 610 that will be protected during the subsequent etching step, and the unshaded portion of the mask 620 represents the areas that will be removed during the subsequent etching step.

The dashed lines 630 represent the active areas of the partially formed transistor (e.g., the source, drain, and gate). The dashed lines 630 do not form part of the gate trench photo mask 620, and are illustrated primarily to show how the mask 620 is aligned over the device 100. As discussed in more detail below, the unshaded portion of the mask 620 can advantageously be larger than necessary to allow for possible mask misalignment.

Figure 10:
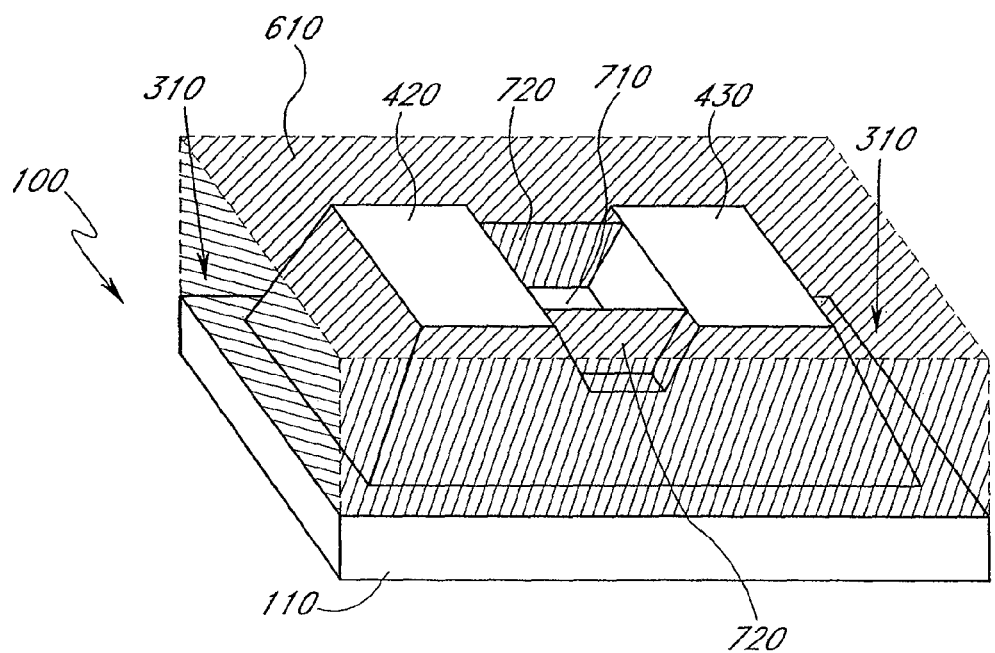

FIG. 10 illustrates the device 100 of FIG. 8 after the gate trench photo mask 620 has been applied, and a gate trench 710 has been etched to form a transistor having a gate trench 710 with nonconductive sidewalls 720. The gate trench 710 can be formed using conventional photolithography and etching techniques. Conventional photolithography and etching techniques are described above, and are well known to those of skill in the art.

For example, in some embodiments, a photoresist film is deposited on the nonconductive material 610 and exposed to radiation through the gate trench photo mask 620. Following this exposure, the photoresist film is developed to form a photoresist mask on the surface of the nonconductive material 610, and the nonconductive material 610 is etched to form the gate trench 710. In some embodiments, the gate trench 710 is etched using a process such as, for example, ion milling, reactive ion etching, or chemical etching. If an etching process involving a chemical etchant is selected, any of a variety of well-known etchants can be used, such as for example, $CF_4$.

Because the gate trench 710 is formed by etching the nonconductive material 610 rather than the substrate 110, a different etchant is typically used to perform this etch than the etchant used to form the isolation trench 310 and the gate trench 510, as described above in connection with FIGS. 4 and 7. This is because very few, if any, etchants are used in conventional semiconductor processing that are effective at etching both the nonconductive material 610 and the material comprising the substrate 110.

Due to the lack of such etchants, it has been difficult in the past to fabricate a transistor with a trench gate without also leaving undesirable sidewalls comprising unetched substrate material along the sides of the gate trench. Such sidewalls can form an undesired conductive path through which parasitic current can flow between the source and the drain of the transistor during operation.

Unlike a transistor having a trench gate formed using conventional methods, however, the transistor formed using the process illustrated in FIGS. 1-10 advantageously has a gate trench 710 with nonconductive sidewalls 720. By etching the gate trench 510 and completing the etch of the isolation trench 310 in the same step, the amount of unetched substrate material along the sidewalls of the gate trench 510 is reduced or eliminated altogether. As a result, when the gate trench 710 is etched, the sidewalls 720 are formed of the nonconductive material 610 rather than the substrate material. Because an undesired conductive path is not formed at the intersection of the gate trench 710 and the isolation trench 310, the flow of parasitic current between the source 420 and the drain 430 through the sidewalls 720 is advantageously reduced.

Another advantage of forming a transistor using the process illustrated in FIGS. 1-10 is that, in some embodiments, the isolation trench 310 can be made deeper than the gate trench 710. By making the isolation trench 310 deeper than the gate trench 710, the gate trench bottoms of neighboring transistors can be advantageously isolated from one another.

Another advantage of forming a transistor using the process illustrated in FIGS. 1-10 is that the gate area photo mask 320 and the gate trench photo mask 620 can be made to allow for potential mask misalignment. For example, because the sidewalls 720 of the gate trench 710 comprise the nonconductive material 610 rather than the material of the substrate 110, they do not form a conductive path between the source 420 and the drain 430, and thus they can be offset from the outer edges of the gate trench 710. Accordingly, in some embodiments, the unshaded portion of the gate trench photo mask 620 can be wider than necessary to allow for possible mask misalignment. Because it can be difficult to precisely align multiple photo masks over the device 100 during successive masking and etching steps, the allowance for potential mask misalignment provided by the process illustrated in FIGS. 1-10 presents significant advantages.

Those of ordinary skill in the art will understand that a variety of additional processes can be performed in between any of the aforementioned processes. For example, conventional processes related to the electrical characteristics of the transistor can be performed, such as depositing doping implants or other additional layers. Such additional processes are well known to those of skill in the art.

Figure 11:
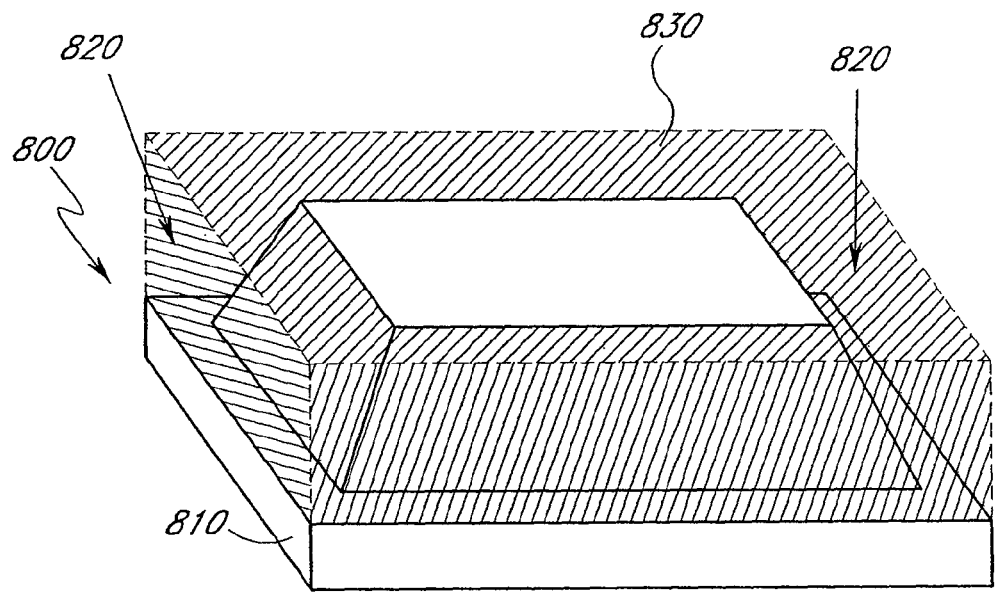
FIGS. 11-16 illustrate the formation of an integrated circuit transistor in accordance with another embodiment of the present invention.

FIG. 11 is a perspective view of a semiconductor device 800 in which a transistor can be formed. The device 800 comprises a semiconductor substrate 810 having an isolation trench 820 formed therein, which is filled with a nonconductive material 830, as is well-known to those of skill in the art. The substrate 810 of the device 800, like that of the device 100 illustrated in FIGS. 1-10, may comprise any of a wide variety of suitable materials that are known to those of skill in the art. In addition, although a single device 800 is illustrated in FIG. 11, those of skill in the art will understand that a plurality of devices 800 are preferably fabricated simultaneously on the same substrate 810.

Figure 12:
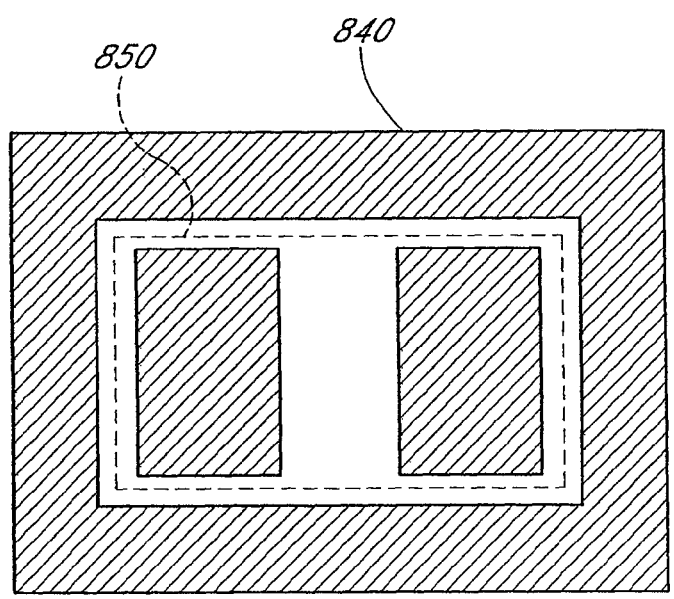

FIG. 12 illustrates a gate area photo mask 840 to be applied to the device 800 illustrated in FIG. 11. The shaded portion of the mask 840 represents the area of the substrate 810 that will not be etched after applying conventional photolithography and etching techniques, whereas the unshaded portion of the mask 840 represents the area of the substrate 810 that will be etched. In the embodiment illustrated in FIG. 12, the mask 840 extends into the area in which the isolation trench 820 is formed.

The dashed line 850 represents the boundary between the upper surface of the substrate 810 and the surrounding isolation trench 830. The dashed line 850 does not form part of the gate area photo mask 840, and is illustrated primarily to show how the mask 840 is aligned over the device 800.

Figure 13:
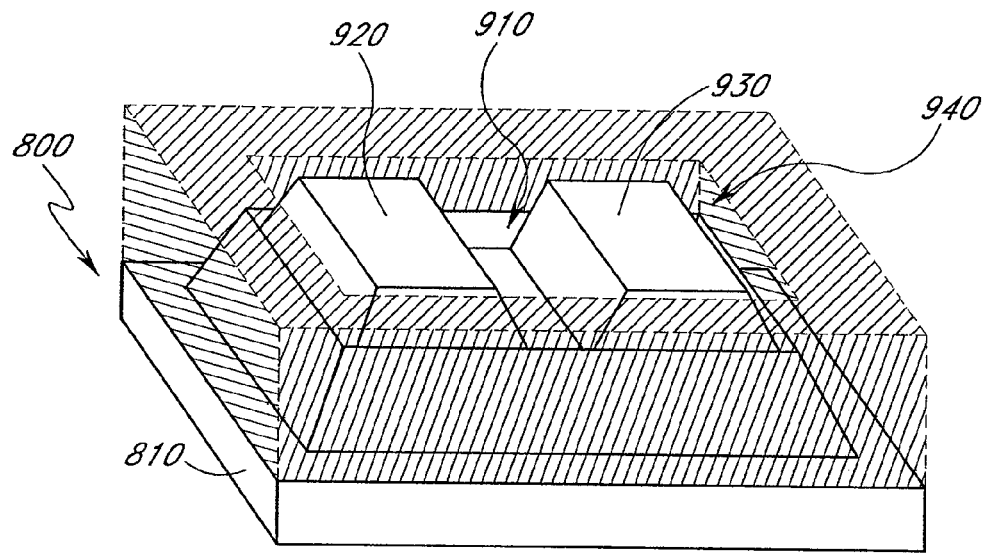

FIG. 13 illustrates the device 800 of FIG. 11 after application of the gate area photo mask 840 and subsequent etching. As illustrated in FIG. 13, a gate trench 910 is etched into the substrate 810. In some embodiments, gate trench 910 forms with rounding at the bottom, or U-shaped, so as to avoid sharp bends in the interface between the gate trench 910 and the substrate 810. In addition, an area of the substrate 810 surrounding the source/gate/drain area 910, 920, 930 is etched to form a separation trench 940. The separation trench 940 is surrounded by a ridge 1140 of unetched substrate material. The source 920 and drain 930 of the partially formed transistor also remain unetched.

The gate trench 910 and the separation trench 940 can be etched using conventional photolithography and etching techniques. For example, in some embodiments, a photoresist film is deposited on semiconductor device 800, exposed to radiation through the gate area photo mask 840, and developed to form a photoresist mask on the surface of the substrate 810. The substrate 810 is then etched using at least one suitable etching process, such as, for example, ion milling, reactive ion etching, or chemical etching. If an etching process involving a chemical etchant is selected, any of a variety of well-known etchants can be used, such as, for example, $Cl_2$.

Figure 14:
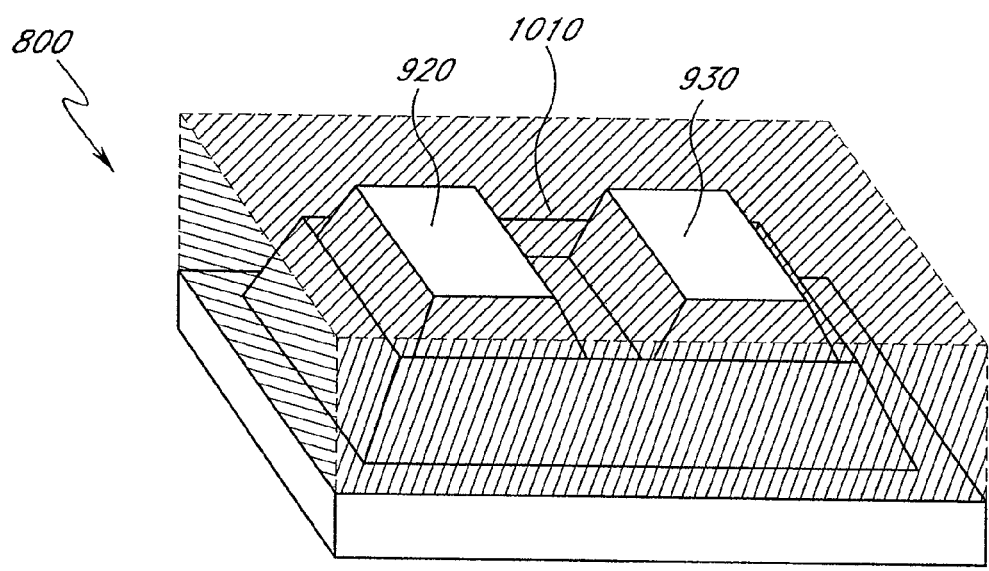

FIG. 14 illustrates the device 800 of FIG. 13 after a nonconductive material 1010 has been deposited over the partially formed transistor. The nonconductive material 1010 fills the gate trench 910 and the separation trench 940. The nonconductive material 1010 can comprise any of a wide variety of materials, such as, for example, an oxide material, preferably a high density plasma oxide (HDP oxide). The nonconductive material 1010 can be deposited using any suitable deposition process, such as, for example, CVD or PVD. The nonconductive material 1010 can then be polished back, if necessary, to expose the source 920 and the drain 930 using any suitable polishing process, such as, for example, CMP.

Figure 15:
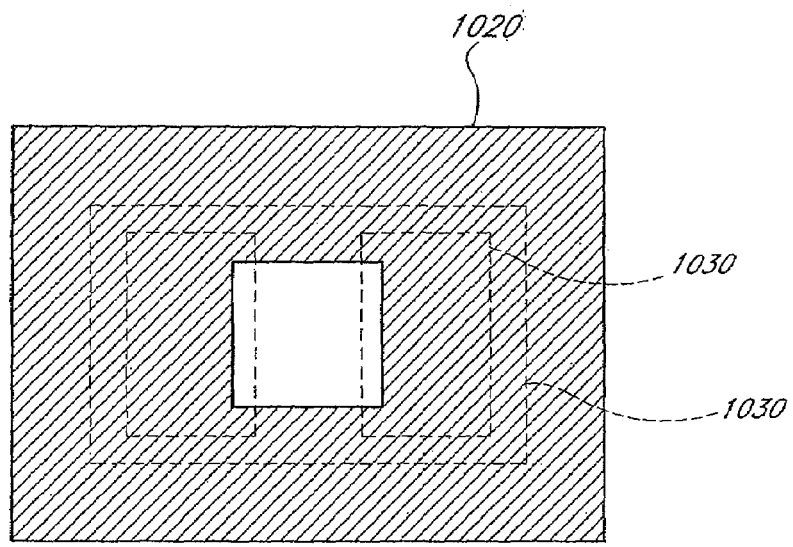

FIG. 15 illustrates a gate trench photo mask 1020 to be applied to the device 800 illustrated in FIG. 14. The shaded portion of the mask 1020 represents the areas of the substrate 810 and the nonconductive material 820 that will be protected during the subsequent etching step, and the unshaded portion of the mask 1020 represents the areas that will be removed during the subsequent etching step.

The dashed lines 1030 represent the active areas of the partially formed transistor (e.g., the source, drain, and gate) and the surrounding ridge 1140 of substrate material. The dashed lines 1030 do not form part of the gate trench photo mask 1020, and are illustrated primarily to show how the mask 1020 is aligned over the device 800. As discussed above, the unshaded portion of the mask 1020 can advantageously be larger than necessary to allow for possible mask misalignment.

Figure 16:
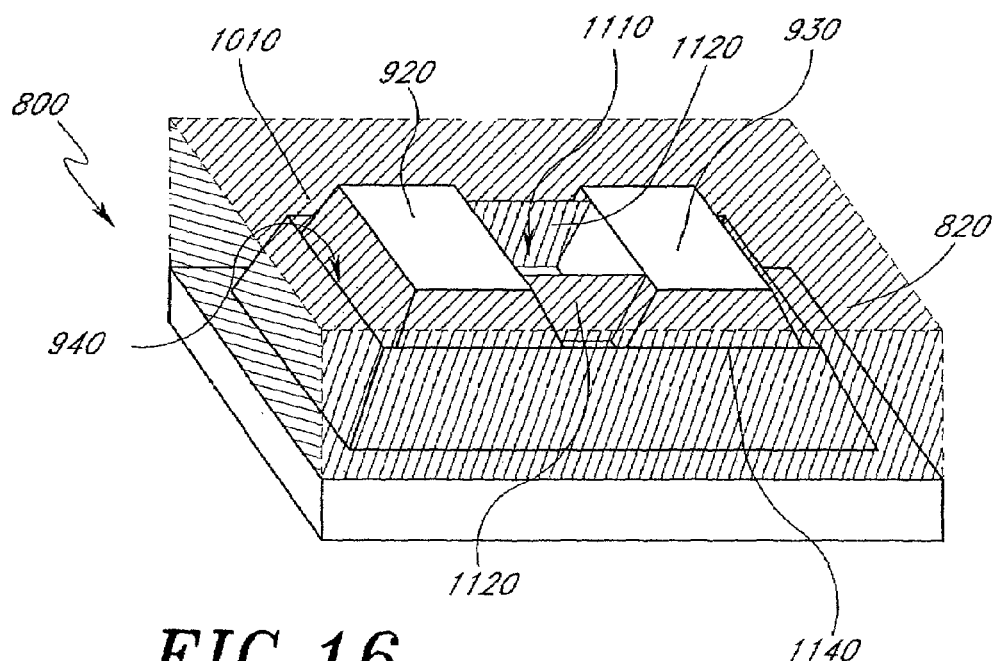

FIG. 16 illustrates the device 800 of FIG. 14 after the gate trench photo mask 1020 has been applied and a gate trench 1110 has been etched to form a transistor having a gate trench 1110 with nonconductive sidewalls 1120. The gate trench 1110 can be formed using conventional photolithography and etching techniques. Conventional photolithography and etching techniques are described above, and are well known to those of skill in the art.

For example, in some embodiments, a photoresist film is deposited on the nonconductive material 1010 and exposed to radiation through the gate trench photo mask 1020. Following this exposure, the photoresist film is developed to form a photoresist mask on the surface of the nonconductive material 1010, and the nonconductive material 1010 is etched to form the gate trench 1110. In some embodiments, the gate trench 1110 is etched using a process such as, for example, ion milling, reactive ion etching, or chemical etching. If an etching process involving a chemical etchant is selected, any of a variety of well-known etchants can be used, such as for example, $CF_4$.

As illustrated in FIG. 16, the transistor comprises a source 920, a drain 930, and a gate trench 1110 surrounded by a separation trench 940 filled with a nonconductive material 1010. In some embodiments, the depth of the separation trench 940 and the depth of the gate trench 1110 are approximately equal and are shallower than the isolation trench 820. In one exemplary embodiment, the depth of the separation trench 940 and the gate trench 1110 falls within the range of about 50 nm to about 300 nm, preferably about 200 nm, and the depth of the isolation trench 820 falls within the range of about 300 nm to about 500 nm, preferably about 350 nm.

In the embodiment illustrated in FIG. 16, the separation trench 940 surrounds the transistor on all sides. In other embodiments, the separation trench 940 can have a different shape, such as one that does not completely surround the source 920 and the drain 930 of the transistor. For example, in one embodiment, the shape of the separation trench 940, when viewed from above, resembles a letter "H" (rather than a FIG. 8, as in the illustrated embodiment), such that one side of the source 920 and one side of the drain 930 are in contact with the ridge 1140 of substrate material.

Like the transistor discussed above, the transistor formed using the process illustrated in FIGS. 11-16 advantageously has a gate trench 1110 with nonconductive sidewalls 1120. By etching the gate trench 910 and the separation trench 940 in the same step, there is no unetched substrate material along the sidewalls of the gate trench 910. As a result, when the gate trench 1110 is etched, the sidewalls 1120 are formed of the nonconductive material 1010 rather than the substrate material. Accordingly, an undesired conductive path is not formed between the source 920 and the drain 930, and the flow of parasitic current through the sidewalls 1120 is advantageously reduced.

Another feature of forming a transistor using the process illustrated in FIGS. 11-16 is that the transistor is separated from the ridge 1140 of substrate material by the isolation trench 820. Advantageously, the location of the ridge 1140 of substrate material avoids shorting between neighboring transistors.

In addition, as discussed above, an advantage of forming a transistor using the process illustrated in FIGS. 11-16 is that a gate trench photo mask 1020 can be made to allow for potential mask misalignment. Because it can be difficult to precisely align multiple photo masks over the device 800 during successive masking and etching steps, the allowance for potential misalignment of the gate trench photo mask 1020 presents significant advantages.

As discussed above, those of ordinary skill in the art will understand that a variety of additional processes can be performed in between any of the aforementioned processes. For example, conventional processes related to the electrical characteristics of the transistor can be performed, such as depositing doping implants or other additional layers. Such additional processes are well known to those of skill in the art.

Although this invention has been described in terms of certain preferred embodiments, other embodiments that are apparent to those of ordinary skill in the art, including embodiments that do not provide all of the features and advantages set forth herein, are also within the scope of this invention. Accordingly, the scope of the present invention is defined only by reference to the appended claims.

We claim:

1. A method of fabricating a transistor comprising:
   patterning a substrate with a first mask;
   forming a first isolation trench in the substrate;
   depositing a nonconductive material in the first isolation trench;
   patterning the substrate with a second mask;
   forming a first gate trench;
   forming a separation trench such that a ridge of substrate material extends around at least portions of a source region, a drain region and a gate region and wherein the separation trench is interposed between the ridge of substrate material and the source, drain, and gate regions along at least portions of the source, drain, and gate regions;
   filling the first gate trench and the separation trench with the nonconductive material;
   patterning the nonconductive material with a third mask; and
   removing the nonconductive material from at least a region of the first gate trench, thereby forming a second gate trench with sidewalls comprising the nonconductive material.

2. The method of claim 1, wherein the second mask extends into the area in which the isolation trench is formed.

3. The method of claim 1, wherein the third mask contains at least one feature that is sized to allow for possible mask misalignment.

4. The method of claim 1, wherein the first gate trench and the separation trench are approximately of equal depth.

5. The method of claim 1, wherein at least one of the second gate trench and the separation trench are of a shallower depth than a depth of the isolation trench.

6. The method of claim 1, wherein the separation trench is not interposed between outer sides of the drain and source and the ridge of substrate material.

7. The method of claim 6, wherein the second gate trench, the isolation trench, and the sidewalls define in combination a generally H shaped structure.

8. The method of claim 1, wherein the second gate trench, the isolation trench, and the sidewalls define in combination a generally FIG. 8 shaped structure.

9. The method of claim 1, wherein the nonconductive material comprises high density plasma (HDP) oxide.

10. The method of claim 1, wherein forming the first gate trench and forming the separation trench are performed as the same process step.

11. The method of claim 1, wherein at least one of the isolation trench, the gate trench, and the separation trench is formed via etching.

12. A method of forming a semiconductor device, the method comprising:
    at least partially forming an isolation trench and a gate trench in a substrate;
    forming a separation trench such that a ridge of substrate material extends around at least portions of a source region, a drain region and a gate region and wherein the separation trench is interposed between the ridge of substrate material and the source, drain, and gate regions along at least portions of the source, drain, and gate regions;
    forming a nonconductive material in the isolation trench, the gate trench, and the separation trench; and
    removing at least a portion of the nonconductive material in the gate trench so as to form sidewalls of the gate trench wherein the sidewalls comprise the nonconductive material.

13. The method of claim 12, wherein the gate trench and the separation trench are formed to be of approximately equal depth.

14. The method of claim 12, wherein the gate trench and the separation trench are formed in the same process step.

15. A method of forming a semiconductor device, the method comprising:
    at least partially forming an isolation trench and a gate trench in a substrate;
    forming a separation trench that extends around at least portions of a source region, a drain region and a gate region, wherein the gate trench and the separation trench in combination define generally a FIG. 8 shape;
    forming a nonconductive material in the isolation trench, the gate trench, and the separation trench; and
    removing at least a portion of the nonconductive material in the gate trench so as to form sidewalls of the gate trench wherein the sidewalls comprise the nonconductive material and such that the isolation trench has a greater depth than a depth of the gate trench.

16. The method of claim 15, wherein the gate trench and the separation trench are formed to be of approximately equal depth.

17. The method of claim 15, wherein the gate trench and the separation trench are formed in the same process step.

* * * * *